United States Patent
Gong et al.

(10) Patent No.: US 12,414,368 B2
(45) Date of Patent: Sep. 9, 2025

(54) DISPLAY PANEL AND METHOD OF MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventors: Jixiang Gong, Wuhan (CN); Zhilin Yang, Wuhan (CN)

(73) Assignees: WUHAN CHINA STAR OPTOELECTRONICS, Wuhan (CN); SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 776 days.

(21) Appl. No.: 17/762,043

(22) PCT Filed: Feb. 8, 2022

(86) PCT No.: PCT/CN2022/075484
§ 371 (c)(1),
(2) Date: Mar. 18, 2022

(87) PCT Pub. No.: WO2023/137801
PCT Pub. Date: Jul. 27, 2023

(65) Prior Publication Data
US 2023/0238389 A1      Jul. 27, 2023

(30) Foreign Application Priority Data
Jan. 21, 2022    (CN) .......................... 202210072145.7

(51) Int. Cl.
*H10D 86/40*        (2025.01)
*H10D 86/01*        (2025.01)
(Continued)

(52) U.S. Cl.
CPC ....... *H10D 86/451* (2025.01); *H10D 86/0231* (2025.01); *H10D 86/441* (2025.01);
(Continued)

(58) Field of Classification Search
CPC ............ H01L 27/1248; H01L 27/1288; H01L 27/1251; H01L 29/78633; H10D 86/451; H10D 86/471; H10D 86/441
See application file for complete search history.

(56) References Cited

U.S. PATENT DOCUMENTS 4,907,197 A * 3/1990 Uchida .............. G11C 16/0425
                                                                   365/104
2002/0167009 A1    11/2002 Kim
(Continued)

FOREIGN PATENT DOCUMENTS

CN       107170749 A      9/2017
CN       107664891 A      2/2018
(Continued)

OTHER PUBLICATIONS

Chinese Office Action issued in corresponding Chinese Patent Application No. 202210072145.7 dated Apr. 1, 2025, pp. 1-8, 18pp.

*Primary Examiner* — Peter M Albrecht
(74) *Attorney, Agent, or Firm* — The Roy Gross Law Firm, LLC; Roy Gross

(57) ABSTRACT

A display panel and a method of manufacturing the same are provided. The display panel includes a shielding layer, a thin film transistor device layer, and a first via hole and a second via hole disposed correspondingly, and a third via hole disposed in a bonding area. Specifically, each of the first via hole and the third via hole is a stair-step shaped hole. The first via hole, the second via hole, and the third via hole are (Continued)

etched through a same etching process. Only one-time mask process is required, which saves number of masks and lowers the production cost.

17 Claims, 5 Drawing Sheets

(51) Int. Cl.
  *H10D 30/67* (2025.01)
  *H10K 59/12* (2023.01)
  *H10K 59/126* (2023.01)
  *H10K 59/131* (2023.01)

(52) U.S. Cl.
  CPC ....... *H10D 86/471* (2025.01); *H10D 30/6723* (2025.01); *H10D 86/423* (2025.01); *H10K 59/1201* (2023.02); *H10K 59/126* (2023.02); *H10K 59/131* (2023.02)

(56) References Cited

U.S. PATENT DOCUMENTS

| | | | |
|---|---|---|---|
| 2016/0064421 A1* | 3/2016 | Oh | H01L 27/1251 257/43 |
| 2019/0035870 A1 | 1/2019 | Park et al. | |
| 2021/0066352 A1* | 3/2021 | Cheng | H01L 27/1248 |
| 2021/0366933 A1* | 11/2021 | Zhang | H10D 86/451 |
| 2021/0399024 A1* | 12/2021 | Gong | H10D 86/441 |

FOREIGN PATENT DOCUMENTS

| | | | | |
|---|---|---|---|---|
| CN | 108376672 A | | 8/2018 | |
| CN | 110556298 A | | 12/2019 | |
| CN | 111564458 A | | 8/2020 | |
| CN | 111863839 A | | 10/2020 | |
| CN | 112309990 A | | 2/2021 | |
| CN | 112599541 A | * | 4/2021 | ........... H01L 27/124 |
| JP | 2014229711 A | | 12/2014 | |
| KR | 20180061720 A | | 6/2018 | |

* cited by examiner

DISPLAY PANEL AND METHOD OF MANUFACTURING SAME

CROSS REFERENCE TO RELATED APPLICATIONS

This application is a National Phase of PCT Patent Application No. PCT/CN2022/075484 having International filing date of Feb. 8, 2022, which claims the benefit of priority of Chinese Patent Application No. 202210072145.7, filed Jan. 21, 2022, the contents of which are all incorporated herein by reference in their entirety.

BACKGROUND OF INVENTION

1. Field of Invention

The present application relates to a technical field of design and manufacture of display panels, and particularly to, a display panel and a method of manufacturing the display panel.

2. Related Art

With ever-changing development of display panel manufacturing technology, people have put forward higher requirements on performance and quality of display panels.

Compared with traditional liquid crystal displays (LCDs), organic light-emitting diode (OLED) devices are used in many fields due to their advantages of being light in weight, wide viewing angles, and high luminous efficiency. OLED devices include array substrates. A plurality of thin film transistor devices are arranged in the array substrates, and performance of the thin film transistor devices will directly affect performance of entire light-emitting devices. With development of wearable devices and wearable display fields, people have higher and higher power consumption requirements for display devices. Currently, low temperature poly-crystalline-Si oxide (LTPO) processes and indium gallium zinc oxide (IGZO) processes are used to form display panels with fast response speed and lower power consumption. However, when the above-mentioned devices are fabricated and formed in prior art, the above-mentioned processes cannot be well compatible. In addition, preparation processes are complex, and multiple layers of films and etching processes with more passes are required, which causes higher manufacturing cost and is not conducive to improvement of the overall performance of panels.

Therefore, it is imperative to provide solutions to the problems in the prior art.

SUMMARY OF INVENTION

An object of the present application is to overcome the technical problem that manufacturing processes of light-emitting devices in the prior art are relatively complicated and manufacturing cost is high, which is not conducive to the improvement of the comprehensive performance of the light-emitting devices.

In order to overcome the above-mentioned problem, embodiments of the present application provide a display panel and a method of manufacturing the display panel, so as to effectively improve manufacturing processes of the display panel and reduce production cost of the display panel.

In order to achieve the above-mentioned object, the embodiments of the present application provide technical solutions as follows:

In a first aspect of the embodiment of the present application, the present application provides a display panel, including a display area and a bonding area disposed on a side of the display area, and the display panel including a substrate; a shielding layer disposed on the substrate; and a thin film transistor device layer disposed over the shielding layer and including a first thin film transistor disposed in the display area and a second thin film transistor electrically connected to the first thin film transistor. First source and drain electrodes included in the first thin film transistor are electrically connected to a first active layer through first via holes, second source and drain electrodes included in the second thin film transistor are electrically connected to a second active layer through second via holes, and the first thin film transistor is a dual gate electrode thin film transistor. The display panel further includes a third via hole defined in the bonding area and extending through film layers between the second source and drain electrodes and the substrate, wherein each of the first via holes, the second via holes, and the third via hole is a stair-step shaped hole. Distances from tops of the first via holes and the third via hole to corresponding first step platforms included in the stair-step shaped holes are the same, and the first step platforms and the second active layer are arranged in a same layer.

According to an embodiment of the present application, the third via hole includes the first step platform and a second step platform, the first step platform is located above the second step platform, and an aperture of the third via hole gradually decreases from the first step platform to the second step platform.

According to an embodiment of the present application, a distance between the top of the third via hole and the first step platform is less than a distance between the first step platform and the second step platform, and the distance between the first step platform and the second step platform is greater than a distance between the second step platform and a bottom of the third via hole.

According to an embodiment of the present application, the display panel further includes a metal layer and a fourth via hole, wherein the metal layer is disposed between the second thin film transistor and the third via hole and is electrically connected to the shielding layer through the fourth via hole.

According to an embodiment of the present application, the fourth via hole is a stair-step shaped hole, and the first via holes, the second via holes, the third via hole, and the fourth via hole are prepared and formed by a same etching process.

According to an embodiment of the present application, number of steps of the stair-step shaped hole corresponding to the fourth via hole is the same as number of steps of the third via hole, and step platforms included in the fourth via hole and step platforms included in the third via hole are located at same heights, respectively.

In a second aspect of the embodiment of the present application, the present application provides a display panel, including a display area and a bonding area disposed on a side of the display area, and the display panel including a substrate; a shielding layer disposed on the substrate; and a thin film transistor device layer disposed over the shielding layer and comprising a first thin film transistor disposed in the display area and a second thin film transistor electrically connected to the first thin film transistor, wherein first source and drain electrodes included in the first thin film transistor are electrically connected to a first active layer through first via holes, second source and drain electrodes included in the second thin film transistor are electrically connected to a second active layer through second via holes. The display panel further includes a third via hole defined in the bonding area and extending through film layers between the second source and drain electrodes and the substrate, wherein each of the first via holes, the second via holes, and the third via hole is a stair-step shaped hole, and distances from tops of the first via holes and the third via hole to corresponding first step platforms included in the stair-step shaped holes are the same.

According to an embodiment of the present application, at least one of step platforms in each of the stair-step shaped holes corresponding to the first via hole, the second via hole, and the third via hole is located on a same film layer.

According to an embodiment of the present application, the third via hole includes the first step platform and a second step platform, the first step platform is located above the second step platform, and an aperture of the third via hole gradually decreases from the first step platform to the second step platform.

According to an embodiment of the present application, a distance between the top of the third via hole and the first step platform is less than a distance between the first step platform and the second step platform, and the distance between the first step platform and the second step platform is greater than a distance between the second step platform and a bottom of the third via hole.

According to an embodiment of the present application, the first step platform is disposed in the same layer as the second active layer of the second thin film transistor.

According to an embodiment of the present application, the second step platform is disposed in a film layer corresponding to the first active layer and is located inside the film layer.

According to an embodiment of the present application, an aperture of the third via hole is greater than that of the first via hole and the second via hole.

According to an embodiment of the present application, the display panel further includes a metal layer and a fourth via hole, wherein the metal layer is disposed between the second thin film transistor and the third via hole and is electrically connected to the shielding layer through the fourth via hole.

According to an embodiment of the present application, the fourth via hole is a stair-step shaped hole, and the first via holes, the second via holes, the third via hole, and the fourth via hole are prepared and formed by a same etching process.

According to an embodiment of the present application, number of steps of the stair-step shaped hole corresponding to the fourth via hole is the same as number of steps of the third via hole, and step platforms included in the fourth via hole and step platforms included in the third via hole are located at same heights, respectively.

According to an embodiment of the present application, the metal layer, the first source and drain electrodes, and the second source and drain electrodes are disposed in a same film layer.

According to an embodiment of the present application, a distance between an opening surface of each of the first via hole, the second via hole, the third via hole, and the fourth via hole and the first step platform of the corresponding stair-step shaped hole is same.

According to an embodiment of the present application, the distance between the opening surface of each of the first via hole, the second via hole, the third via hole, and the fourth via hole and the first step platform of the corresponding stair-step shaped hole ranges from 5500 angstroms (Å) to 6500 Å.

According to an embodiment of the present application, the first active layer is a polysilicon oxide semiconductor, and the second active layer is an indium gallium zinc oxide semiconductor.

According to a third aspect of the embodiments of the present application, the present application further provides a method of manufacturing a display panel, including providing a substrate, and fabricating a shielding layer on the substrate; fabricating a thin film transistor device layer on the shielding layer, wherein the thin film transistor device layer comprises a first thin film transistor and a second thin film transistor; preparing a photoresist on the thin film transistor device layer, processing the photoresist so that openings of different depths are formed in regions corresponding to source and drain electrodes of each of the first thin film transistor and the second thin film transistor, and forming a third opening and a fourth opening at portions of the thin film transistor device layer corresponding to a bonding area and the shielding layer, respectively; etching the thin film transistor device layer, wherein a third via hole, a fourth via hole, and first step platforms corresponding to the third via hole and the fourth via hole are formed by etching portions of the thin film transistor device layer corresponding to the third opening and the fourth opening; etching the openings of the different depths in the regions corresponding to the source and drain electrodes, together with portions of the thin film transistor device layer corresponding to the openings to form first via holes and a fifth via hole, wherein the first via holes and the fifth via hole each are etched to a depth of the first step platform, and the third via hole and the fourth via hole are etched to a depth of a second step platform; etching the photoresist and film layers to form second via holes, wherein the first via holes, the second via holes, and the fifth via hole are etched to surfaces of corresponding active layers, the third via hole is etched to a surface of the substrate, and the fourth via hole is etched to a surface of the shielding layer; forming a metal layer in each of the first, second, fourth, and fifth via holes, and forming a planarization layer on the metal layer, wherein the planarization layer fills the third via hole; and fabricating pixel electrodes on the planarization layer and encapsulating the planarization layer to complete fabrication of the display panel.

The embodiments of the present application have advantageous effects as follows:

The embodiments of the present application provide the display panel and the method of manufacturing the same. The display panel includes the shielding layer, the thin film transistor device layer, the first thin film transistor and the second thin film transistor disposed in the thin film transistor device layer, the first via holes and the second via holes disposed corresponding to the first thin film transistor and the second thin film transistor, and a third via hole disposed in the bonding area. Specifically, the first via holes, the second via holes, and the third via hole each are stair-step shaped holes, and the first via holes and the third via hole are etched through a same etching process. Thus, the same etching is used to form a plurality of different via hole structures in the thin film transistor device layer, which effectively saves the number of photomasks, improves manufacturing process of the display panel, and reduces the production cost.

DESCRIPTION OF PREFERRED EMBODIMENTS

The following embodiments are referring to the accompanying drawings for exemplifying specific implementable embodiments of the present disclosure.

With ever-changing development of display panel manufacturing technology, people have put forward higher requirements on performance and quality of display panels. It is expected that display panels being manufactured have not only superior quality, but also good comprehensive performance.

In prior art, when high-performance display panels are fabricated, multiple preparation processes are generally required for the production. Especially when fabricating display panels having composite structure, such as forming low temperature polycrystalline oxide thin film transistors and indium gallium zinc oxide thin film transistors, more times of etching are often required, giving rise to complicated manufacturing processes, and higher production cost.

Embodiments of the present application provide a display panel, capable of effectively simplifying processes of manufacturing high-performance display panel.

Figure 1:
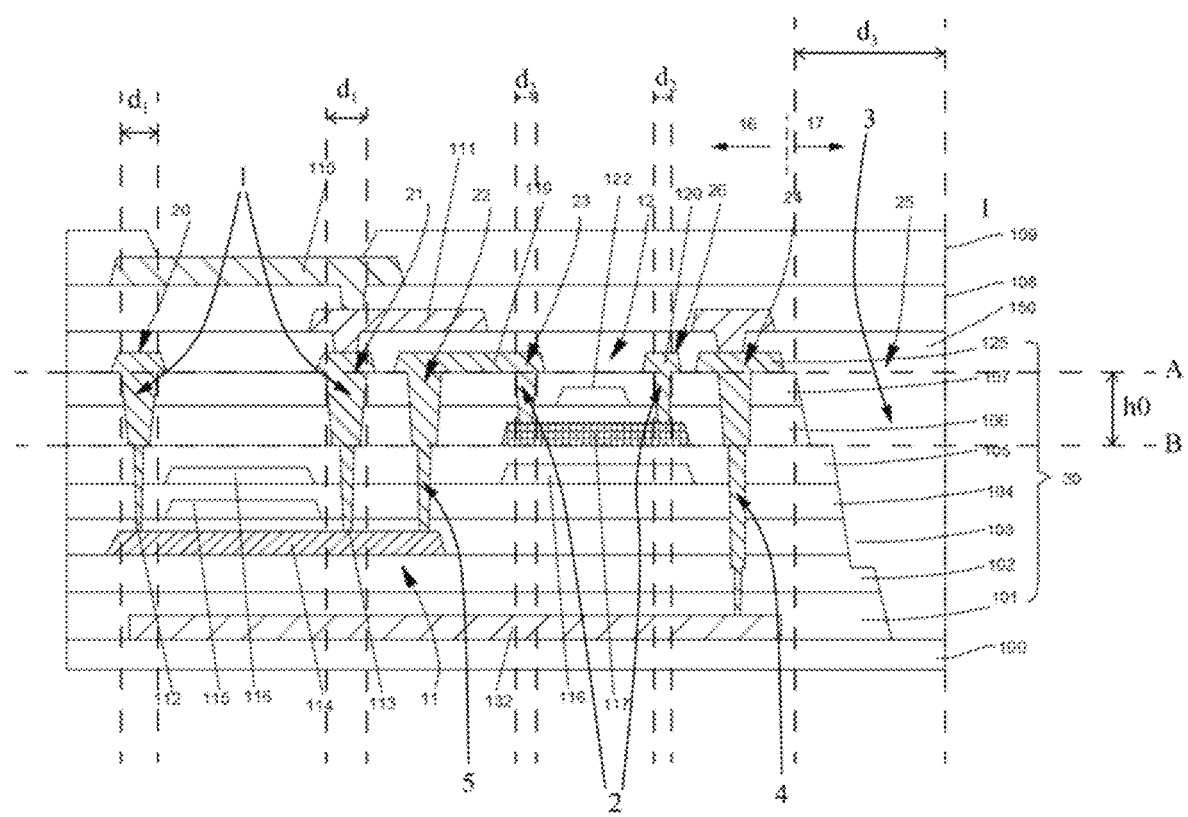
FIG. 1 is a schematic film layer structural view of a display panel provided by an embodiment of the present application.

As shown in FIG. 1, FIG. 1 is a schematic film layer structural view of a display panel provided by an embodiment of the present application. A display panel includes a substrate 100, a shielding layer 132, and a thin film transistor device layer 30. Specifically, the shielding layer 132 is disposed on the substrate 100, and the thin film transistor device layer 30 is disposed on the shielding layer 132. In the embodiment of the present application, a material of the substrate 100 may be a glass substrate, and a material of the shielding layer 132 may be a metal material, and preferably, the metal material is molybdenum (Mo), aluminium (Al), and other materials. By disposing the metal shielding layer 132 at a bottom of the display panel, static electricity inside the display panel is shielded and performance of the display panel is improved.

Further, the thin film transistor device layer 30 further includes a second substrate 101, a buffer layer 102, and a first thin film transistor 11, and a second thin film transistor 12 disposed in the thin film transistor device layer 30.

Specifically, the second substrate 101 is disposed on the shielding layer 132 and completely covers the shielding layer 132. In addition, the second substrate 101 may be a flexible substrate, and the buffer layer 102 is disposed on the second substrate 101. The buffer layer 102 is preferably a polyimide film layer.

In the embodiment of the present application, a first thin film transistor 11 and a second thin film transistor 12 are provided in the thin film transistor device layer 30. The second thin film transistor 12 is disposed on one side of the first thin film transistor 11. The first thin film transistor 11 and the second thin film transistor 12 are arranged in a display area of the display panel. Specifically, the first thin film transistor 11 includes a first active layer 114, a first source electrode 112, a first drain electrode 113, a first gate electrode 115, a first gate electrode 116, and interlayer dielectric layers disposed between electrode layers. Correspondingly, the second thin film transistor 12 includes a second active layer 117, a second source electrode 119, a second drain electrode 120, a second gate electrode 122, and interlayer dielectric layers correspondingly disposed between the electrodes.

Specifically, the first active layer 114 is disposed on the buffer layer 102, a first gate insulating layer 103 is disposed on the buffer layer 102, and the first gate insulating layer 103 covers the first active layer 114. The first gate electrode 115 is disposed on the first gate insulating layer 103 and is located corresponding to the first active layer 114. The second gate insulating layer 104 is disposed on the first gate insulating layer 103 and completely covers the first gate electrode 115. In addition, a gate electrode 116 is disposed on the second gate insulating layer 104 and correspondingly disposed in a region above the first gate 115. In this way, the first thin film transistor 11 is formed into a dual gate electrode structure, so as to effectively improve various performances of the thin film transistor.

Furthermore, a passivation layer 105 is disposed on the second gate insulating layer 104 and completely covers the first gate electrode 116. A third gate insulating layer 106 is disposed on the passivation layer 105, a second passivation layer 107 is disposed on the third gate insulating layer 106, and a metal layer is disposed on the second passivation layer 107. In the embodiment of the present application, the metal layer is mainly a source/drain electrode and signal lines of the thin film transistor, wherein the source/drain electrode and the signal lines are all disposed on the second passivation layer 107 and are made of a same material.

Specifically, a metal layer 125 includes a first source electrode 112 and a first drain electrode 113. The first source electrode 112 and the first drain electrode 113 are disposed on the second passivation layer 107 and correspondingly disposed in corresponding regions on both sides of the first active layer 114.

The display panel includes a first via hole 20 and a first via hole 21, wherein the first source electrode 112 is electrically connected to the first active layer 114 through the first via hole 20, and the first drain electrode 113 is electrically connected to the first active layer 114 through the first via hole 21, thereby forming a main structure of the first thin film transistor 11.

Further, the second thin film transistor 12 is disposed on one side of the first thin film transistor 11 and located at a different height of the thin film transistor device layer 30. Specifically, the second active layer 117 of the second thin film transistor 12 is disposed on the passivation layer 105, the second gate electrode 122 is disposed on the third gate insulating layer 106, and the second passivation layer 107 completely covers the second gate electrode 122.

Furthermore, the metal layer 125 also includes a second source electrode 119 and a second drain electrode 120. Specifically, the second source electrode 119 and the second drain electrode 120 are disposed on the second passivation layer 107 and are located in the same layer as the first source electrode 112 and the first drain electrode 113.

Further, the display panel further includes a second via hole 23 and a second via hole 26. The second via hole 23 and the second via hole 26 are correspondingly disposed in a region above the second active layer 117. The second source electrode 119 is electrically connected to one end of the second active layer 117 through the second via hole 23, and the second drain electrode 120 is electrically connected to the other end of the second active layer 117 through the second via hole 26. Thus, the structure of the second thin film transistor 12 is finally formed.

In the embodiment of the present application, the second active layer 117 is correspondingly disposed in an upper region above the first gate electrode 116. The first thin film transistor 11 and the second thin film transistor 12 are electrically connected. Specifically, the second source electrode 119 is electrically connected to the first active layer 114 through a fifth via hole 22. In this way, one side of the second source electrode 119 is electrically connected to the first active layer 114 of the first thin film transistor through the fifth via hole 22, and the other side of the second source electrode 119 is electrically connected to the second active layer 117 of the second thin film transistor through the second via hole 23.

In addition, the display panel further includes a fourth via hole 24 arranged on one side of the second thin film transistor 12 and located close to a bonding area 17. The metal layer 125 is disposed in a region corresponding to the fourth via hole 24. The metal layer 125 is electrically connected to the shielding layer 132 at a bottom through the fourth via hole 24, so as to effectively shield the static electricity formed in the thin film transistor, thereby improving various performances of the device.

Further, a third via hole 25 is further included in the bonding area 17 on one side of the display area 16 of the display panel. The third via hole 25 extends through the thin film transistor device layer 30 and exposes a surface of the substrate 100 at the bottom of display panel.

In the embodiment of the present application, each of the first via hole 20, the first via hole 21, the second via hole 23, the second via hole 26, the third via hole 25, the fourth via hole 24, and the fifth via hole 22 is a stair-step shaped hole and is formed by etching through a same mask. Therefore, the formation of multiple via hole structures in the display panel is simplified into one mask process, so as to reduce the manufacturing process of the display panel and lower the production cost.

Specifically, the fourth via hole 24 and the third via hole 25 are configured as deep holes. The first via hole 20, the first via hole 21, the second via hole 23, the second via hole 26, and the fifth via hole 22 are configured as shallow hole structures. Among the stair-step shaped holes corresponding to the above via holes, at least one step platform is located on a same film layer at a same height. Preferably, first step platforms corresponding to each of the above-mentioned via holes are all disposed on the passivation layer 105.

Figure 2:
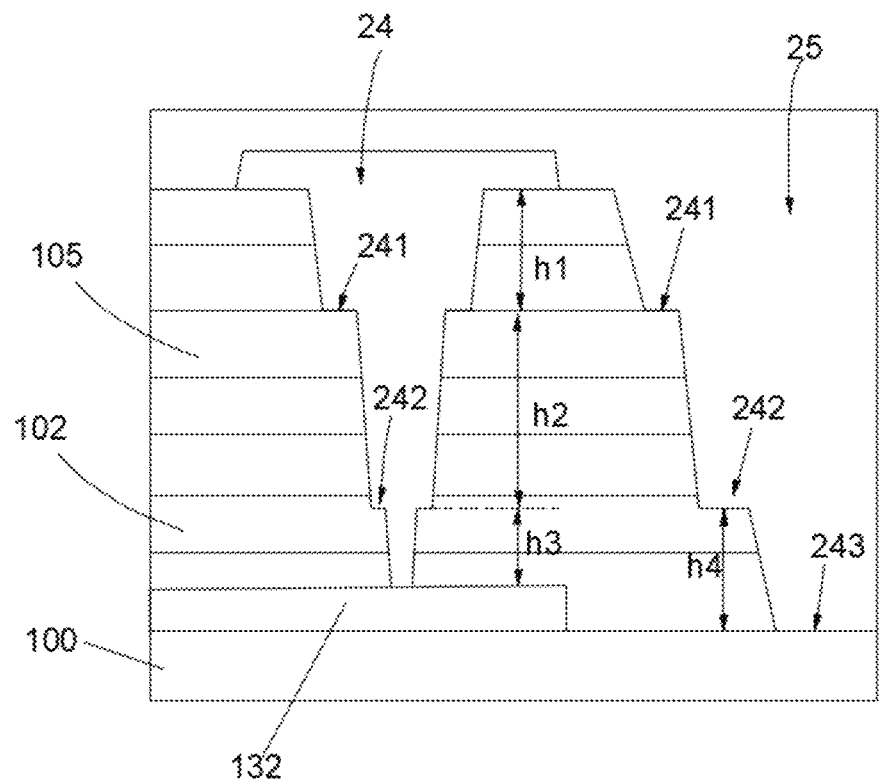
FIG. 2 is a schematic structural view of via holes provided by an embodiment of the present application.

As shown in FIG. 2, FIG. 2 is a schematic structural view of via holes provided by an embodiment of the present application. Specifically, the corresponding via holes in FIG. 2 are described by taking the third via hole 25 and the fourth via hole 24 as examples. In the embodiment of the present application, the third via hole 25 includes a first step platform 241 and a second step platform 242. Specifically, the first step platform 241 is located above the second step platform 242, and an aperture of the third via hole 25 gradually decreases from the first step platform 241 to the second step platform 242. Correspondingly, the above-mentioned relationship also exists in the fourth via hole 24.

In the following embodiments, only the third via hole is taken as an example for description.

In the embodiment of the present application, the first step platform 241 is disposed on the passivation layer 105, and the second step platform 242 is disposed in the buffer layer 102. Specifically, there is a certain distance between the second step platform 242 and an upper surface of the buffer layer 102. That is, the second step platform 242 is etched into part of the buffer layer 102. In the embodiment of the present application, a width of horizontal platforms on both sides of each of the step platforms is set to 0.5 microns (um)-2 um, so as to ensure the connection effect of the electrodes in the via holes.

When the corresponding first step platforms 241 in the third via hole 25 and the fourth via hole 24 are formed by etching, both of the first step platforms 241 are formed by a same etching process. When the corresponding second step platforms 242 in the third via hole 25 and the fourth via hole 24 are formed by etching, both of the second step platforms 242 are also formed by a same etching process. Therefore, the first step platforms 241 and the second active layer 117 are disposed at the same layer and at the same height.

Specifically, a distance between an opening surface of the third via hole 25 and the first step platform 241 is h1, and a distance between the first step platform 241 and the second step platform 242 is h2. Furthermore, In the fourth via hole 24, a distance between the second step platform 242 and an upper surface of the shielding layer 132 is h3. In the third via hole 25, a distance between the second step platform 242 and an exposed surface of the substrate 100 is h4, that is, an upper surface of the substrate 100 is the third step platform 243. In the embodiment of the present application, in order to ensure various performances of the display panel, a height of h1 is set to 5500 angstroms (Å)-6500 Å, a height of h2 is set to 6900 Å~7900 Å, a height of h3 is set to 7000 Å~8000 Å, and a height of h4 is set to 8200 Å~8500 Å.

Figure 3:
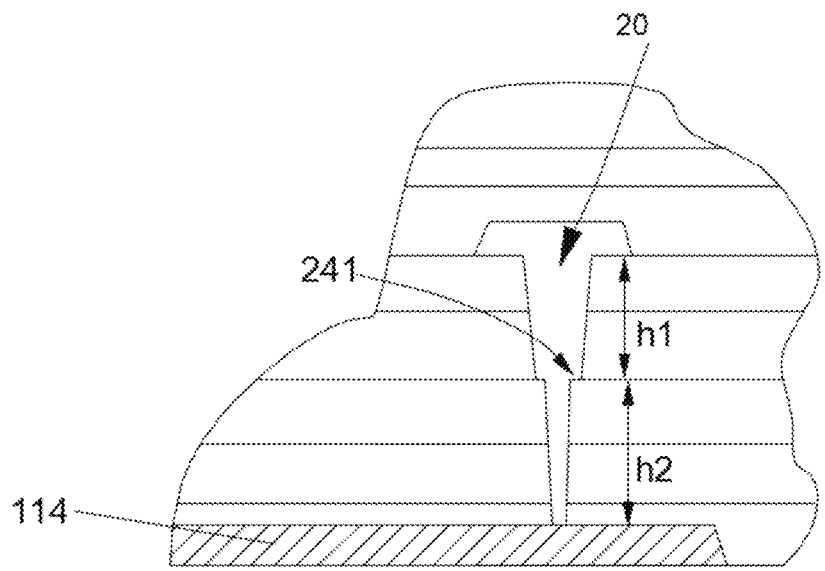
FIG. 3 is a schematic structural view of partial film layers corresponding to a first via hole provided by an embodiment of the present application.

Further, as shown in FIG. 3, it is a schematic structural view of partial film layers corresponding to a first via hole provided by an embodiment of the present application. In the embodiment of this application, since the first via hole 20, the first via hole 21, and the fifth via hole 22 have the same depth and are all stair-step shaped holes, and the first via hole 20, the first via hole 21, and the fifth via hole 22 are etched through the same mask, structures of the above-mentioned via holes can therefore be set to be the same. The first via hole 20 is taken as an example for description. Correspondingly, the height h1 may be set to be the same height as the height h1 in the third via hole. In addition, the distance h2 between the first step platform 241 of the first via hole 20 and the surface of the first active layer 114 is set to be 6900 Å~7900 Å, thereby effectively improving the comprehensive performance of the display panel.

In addition, the display panel further includes a first planarization layer 150 disposed on the passivation layer 105 and covers the metal layer 125. Further, the first planarization layer 150 fills the third via hole 25. The display panel further includes an electrode connection layer 111 and a second planarization layer 108. The electrode connection layer 111 is disposed on the first planarization layer 150, and the second planarization layer 108 is disposed on the first planarization layer 150. The display panel further includes a cathode layer 110 electrically connected to the electrode connection layer 111, and a dielectric layer 109 disposed on the second planarization layer 108.

Figure 8:
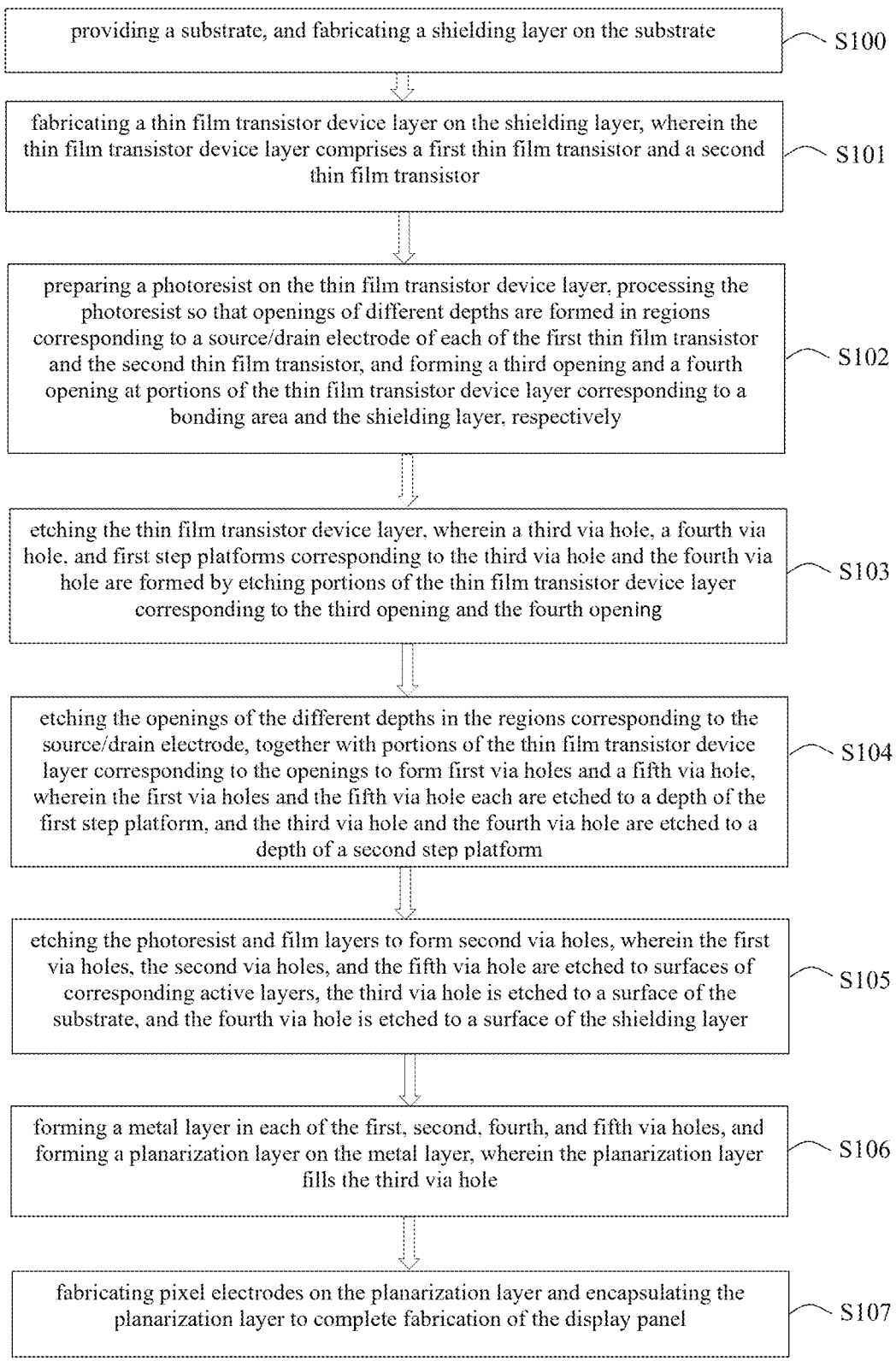
FIG. 8 is a flowchart of a method of manufacturing a display panel provided by an embodiment of the present application.

Further, the embodiments of the present application also provide a method for manufacturing a display panel. Specifically, as shown in FIG. 8, FIG. 8 is a flowchart of a method of manufacturing a display panel provided by an embodiment of the present application. The manufacturing method includes following steps:

S100: providing a substrate, and fabricating a shielding layer on the substrate;

S101: fabricating a thin film transistor device layer on the shielding layer, wherein the thin film transistor device layer comprises a first thin film transistor and a second thin film transistor;

S102: preparing a photoresist on the thin film transistor device layer, processing the photoresist so that openings of different depths are formed in regions corresponding to a source/drain electrode of each of the first thin film transistor and the second thin film transistor, and forming a third opening and a fourth opening at portions of the thin film transistor device layer corresponding to a bonding area and the shielding layer, respectively;

S103: etching the thin film transistor device layer, wherein a third via hole, a fourth via hole, and first step platforms corresponding to the third via hole and the fourth via hole are formed by etching portions of the thin film transistor device layer corresponding to the third opening and the fourth opening;

S104: etching the openings of the different depths in the regions corresponding to the source/drain electrode, together with portions of the thin film transistor device layer corresponding to the openings to form first via holes and a fifth via hole, wherein the first via holes and the fifth via hole each are etched to a depth of the first step platform, and the third via hole and the fourth via hole are etched to a depth of a second step platform;

S105: etching the photoresist and film layers to form second via holes, wherein the first via holes, the second via holes, and the fifth via hole are etched to surfaces of corresponding active layers, the third via hole is etched to a surface of the substrate, and the fourth via hole is etched to a surface of the shielding layer;

S106: forming a metal layer in each of the first, second, fourth, and fifth via holes, and forming a planarization layer on the metal layer, wherein the planarization layer fills the third via hole;

S107: fabricating pixel electrodes on the planarization layer and encapsulating the planarization layer to complete fabrication of the display panel.

Specifically, as shown in FIGS. 4 to 7, FIGS. 4 to 7 are schematic structural views of film layers corresponding to processes of manufacturing a display panel provided by an embodiment of the present application. First, a substrate 100 is provided, then a metal shielding layer 132 is prepared on the substrate 100, and a thin film transistor device layer 30 is prepared and formed on the shielding layer 132.

In the embodiments of this application, a first thin film transistor 11 and a second thin film transistor 12 are correspondingly arranged in the thin film transistor device layer, wherein a first active layer 114 in the first thin film transistor 11 is made of polysilicon oxide semiconductor, and a second active layer 117 in the second thin film transistor 12 is made of indium gallium zinc oxide semiconductor.

The thin film transistor device layer 30 is also provided with a gate layer and an interlayer dielectric layer correspondingly. For details, please refer to the film layer structure of the display panel in FIG. 1, which will not be described in detail here. After the above-mentioned formation is completed, a photoresist 400 is fabricated on the thin film transistor device layer.

Figure 4:
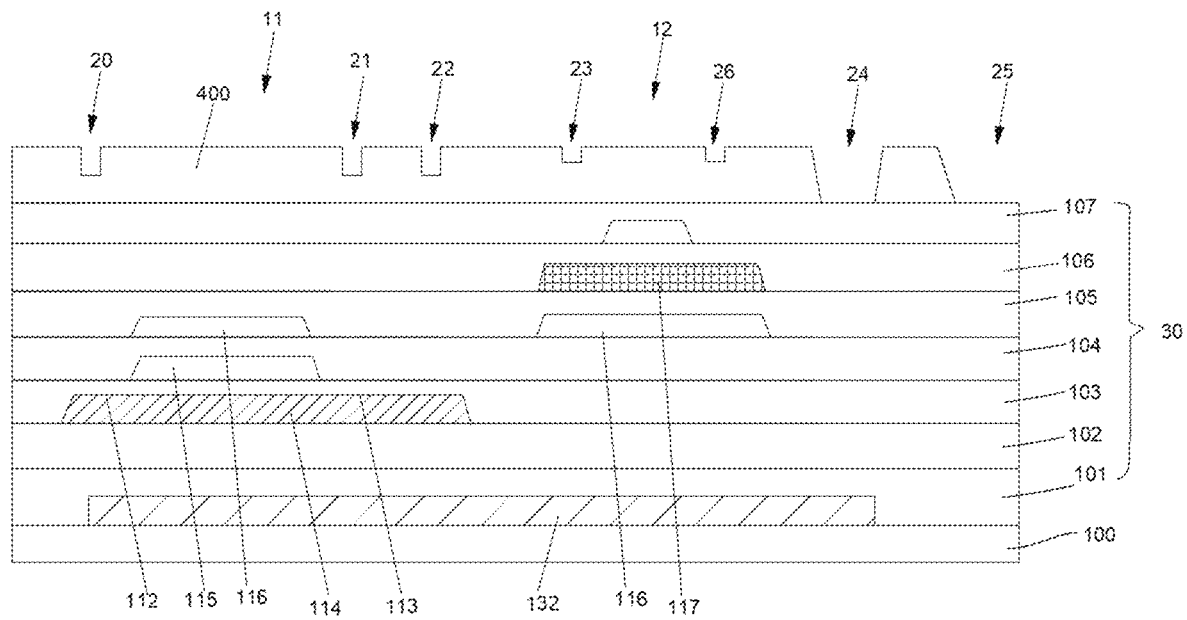
FIGS. 4 to 7 are schematic structural views of film layers corresponding to processes of manufacturing a display panel provided by an embodiment of the present application.

Referring to FIG. 4, the photoresist 400 is subjected to mask processing to form openings with different depths on the photoresist 400. Specifically, first openings are formed on a region over the source/drain electrode corresponding to the first thin film transistor 11. The first openings correspond to first via holes 20 and 21 formed subsequently. Second openings are formed on a region over the source/drain electrode corresponding to second first thin film transistor 12. The second openings correspond to second via holes 23 and 26 formed subsequently. A fifth opening corresponds to a fifth via hole 22 formed subsequently, and a third via hole 25 and a fourth via hole 24 are formed on one side of the thin film transistor device layer.

Specifically, the third via hole 25 and the fourth via hole 24 extend through the photoresist 400. Furthermore, opening depths of the first opening and the fifth opening may be the same, and both are greater than an opening depth of the second opening.

In the embodiment of the present application, when the photoresist 400 is subjected to the mask processing, a half mask process is used to form photoresist structures with openings of different depths as shown in the figure.

Figure 5:
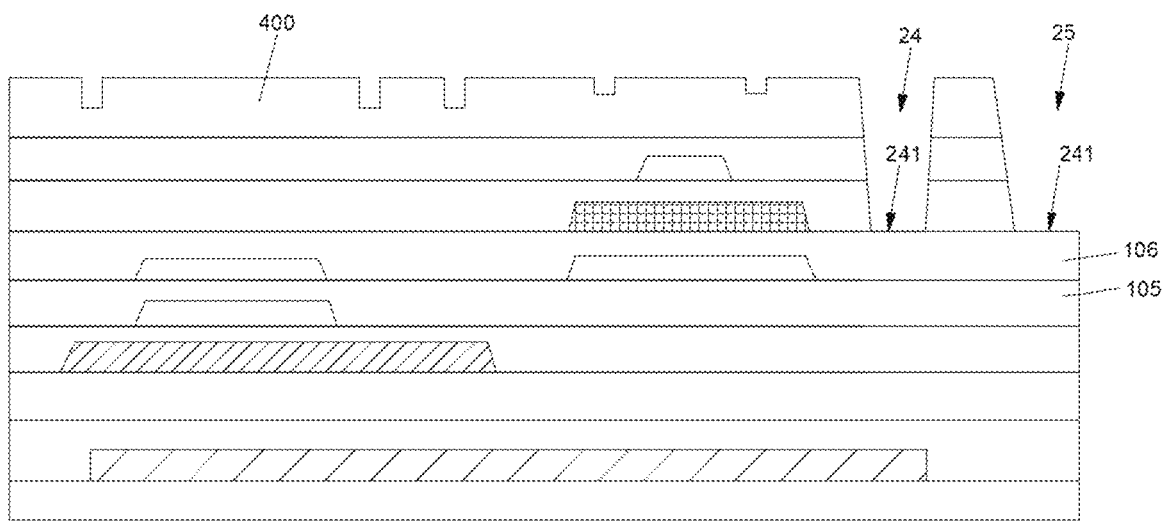

After the photoresist mask is processed, other etching processes are continued. As shown in FIG. 5 for details, film layers in regions corresponding to the third via hole 25 and the fourth via hole 24 are etched. Specifically, the film layers may be etched through a plasma gas etching process. During the etching process, the third via hole 25 and the fourth via hole 24 are etched to a position of a first step platform 241. In the embodiment of the present application, the first step platform 241 and the second active layer of the second thin film transistor 12 are located at a same height, that is, the first step platform 241 is located on the third gate insulating layer 106.

Figure 6:
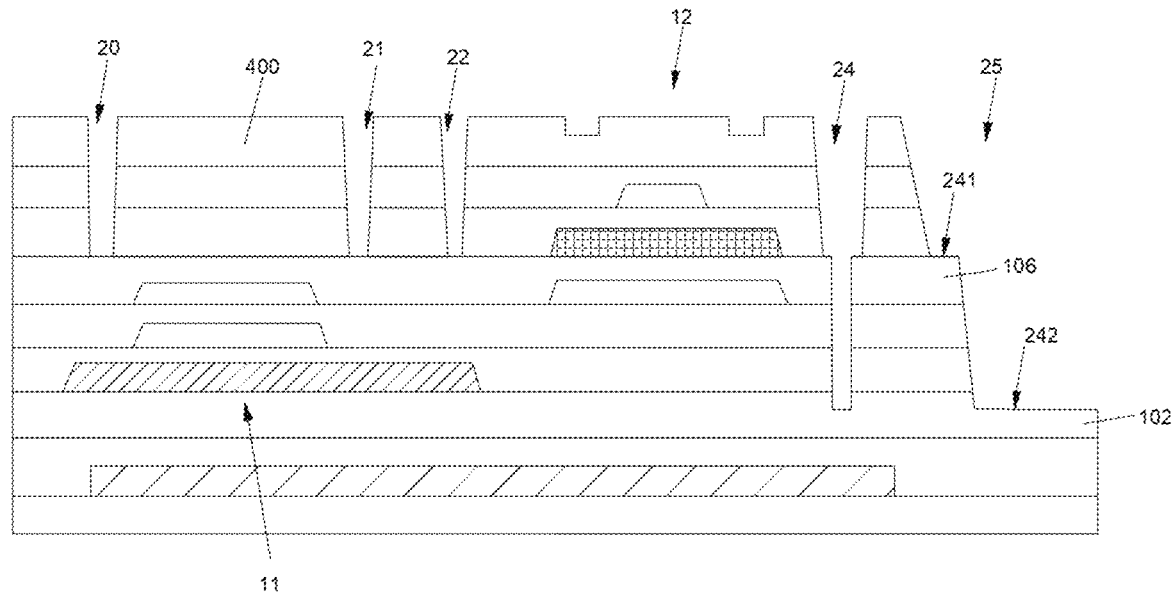

After the first step platform 241 is etched, the film layers are continuously processed. As shown in FIG. 6 for details, the openings on the photoresist 400 in the region corresponding to the first thin film transistor 11 are etched, so that the corresponding shallow openings shown in FIG. 4 form through holes in the layer of the photoresist, respectively. Then, the thin film transistor device layer is etched at the corresponding through holes to form a first via hole 20, a first via holes 21, and a fifth via hole 22.

In the embodiment of the present application, the above-mentioned via holes are etched through the same etching process, and the first via hole 20, the first via hole 21, and the fifth via hole 22 are all etched to the same depth to reach the first step platform 241, that is, the above-mentioned via holes are etched to reach the third gate insulating layer 106.

At the same time, the third via hole 25 and the fourth via hole 24 are continuously etched downward. Specifically, the third via hole 25 and the fourth via hole 24 are etched from the first step platform 241 to the second step platform 242. In the embodiment of the present application, the second step platform 242 is located inside the buffer layer 102, that is, a height difference is formed between the second step platform 242 and the upper surface of the buffer layer 102. Specifically, the first step platform 241, the second step platform 242, and various height differences can refer to FIGS. 2-3.

After the etching is completed, the first step platforms 241 corresponding to the first via hole 20, the first via hole 21, the fifth via hole 22, the third via hole 25, and the fourth via hole 24 are all located at a same vertical level.

Figure 7:
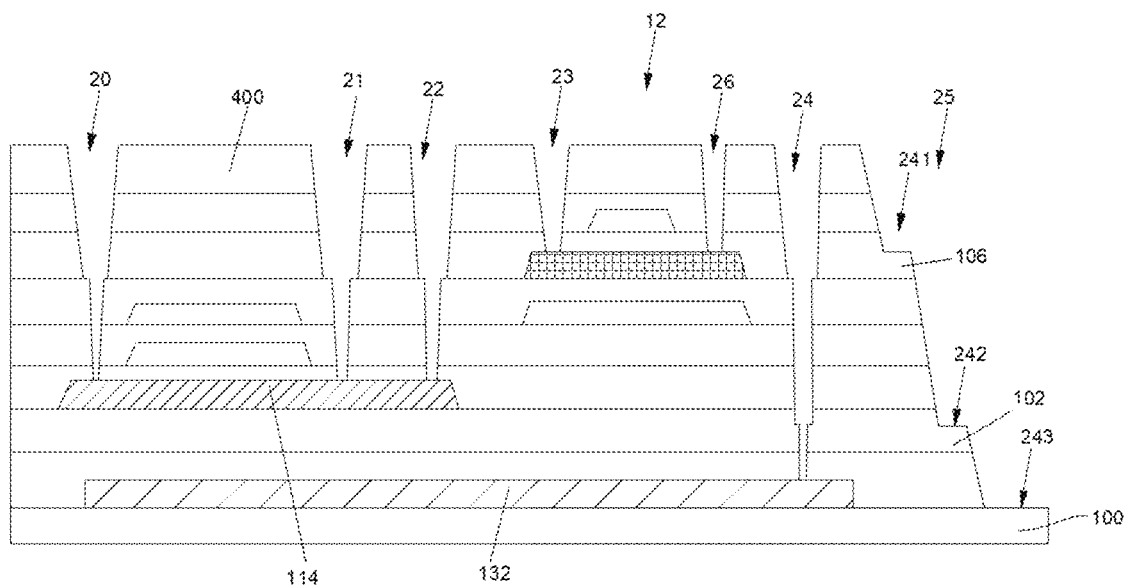

As shown in FIG. 7 for details, each film layer is continuously processed. Further, the openings at a region corresponding to the second thin film transistor 12 are etched, so that the photoresist 400 in the region forms through holes corresponding to a second via hole 23 and a second via hole 26. After the through holes are formed, the film layers in the thin film transistor device layer are continuously etched on the basis of the above-mentioned through holes.

Specifically, the first via hole 20, the first via hole 21, the second via hole 23, the second via hole 26, the fifth via hole 22, and the third via hole 25 are etched simultaneously by using a plasma gas etching method. In the embodiment of the present application, the first via hole 20, the first via hole 21, and the fifth via hole 22 are etched from the first step platform 241 to the first active layer 114 of the first thin film transistor, and the second via hole 23 and the second via hole 26 are etched from the surface of the film layer to the second active layer of the second thin film transistor 12, so that via hole structures corresponding to the source/drain electrode of each of the first and second thin film transistors are formed.

At the same time, the third via hole 25 and the fourth via hole 24 are to be continuously etched such that the third via hole 25 is etched from the second step platform 242 to the upper surface of the substrate 100, and the fourth via hole 24 is etched from the second step mesa 242 to the upper surface of the shielding layer 132.

Finally, complete etching processes on all the via hole structures in the display panel. In the embodiment of the present application, only one-time mask process is required, which effectively saves the number of masks and the process of exposure and etching, thereby simplifying manufacturing processes of backlight, and reducing the production cost of the display panel.

Further, after each via hole is etched, a metal layer is fabricated in the first via hole 20, the first via hole 21, the second via hole 23, the second via hole 26, the fifth via hole 22, and the fourth via hole 24, respectively, to form the source/drain electrode of the first and second thin film transistors. Furthermore, a first planarization layer is prepared and formed on the metal layer and the third via hole 25 is filled with the first planarization layer. Then, continue to fabricate other film layers on the first planarization layer, such as pixel electrodes and other film layers, and carry out encapsulating processes. Finally, the structure of the display panel provided in the embodiments of the present application is completed.

The display panel and the method of manufacturing the display panel provided by the embodiments of the present application are described in detail above. The principles and implementations of the present application are described with specific examples herein. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. A display panel, comprising a display area and a bonding area disposed on a side of the display area, and the display panel comprising:
   a substrate;
   a shielding layer disposed on the substrate; and
   a thin film transistor device layer disposed over the shielding layer and comprising a first thin film transistor disposed in the display area and a second thin film transistor electrically connected to the first thin film transistor, wherein first source and drain electrodes included in the first thin film transistor are electrically connected to a first active layer through first via holes, second source and drain electrodes included in the second thin film transistor are electrically connected to a second active layer through second via holes, and the first thin film transistor is a dual gate electrode thin film transistor, and
   wherein the display panel further comprises a third via hole defined in the bonding area and extending through film layers between the second source and drain electrodes and the substrate, wherein each of the first via holes, and the third via hole is a stair-step shaped hole, distances from tops of the first via holes and the third via hole to corresponding first step platforms included in the stair-step shaped holes are the same, and the first step platforms and the second active layer are arranged in a same layer,
   wherein the display panel further comprising a metal layer and a fourth via hole wherein the metal layer is disposed between the second thin film transistor and the third via hole and is electrically connected to the shielding layer through the fourth via hole.

2. The display panel of claim 1, wherein the third via hole comprises the first step platform and a second step platform, the first step platform is located above the second step platform, and an aperture of the third via hole gradually decreases from the first step platform to the second step platform.

3. The display panel of claim 2, wherein a distance between the top of the third via hole and the first step platform is less than a distance between the first step platform and the second step platform.

4. The display panel of claim 1, wherein the fourth via hole is a stair-step shaped hole, and the first via holes, the second via holes, the third via hole, and the fourth via hole are prepared and formed by a same etching process.

5. The display panel of claim 4, wherein number of steps of the stair-step shaped hole corresponding to the fourth via hole is the same as number of steps of the third via hole, and step platforms included in the fourth via hole and step platforms included in the third via hole are located at same heights, respectively.

6. A display panel, comprising a display area and a bonding area disposed on a side of the display area, and the display panel comprising:
   a substrate;
   a shielding layer disposed on the substrate; and
   a thin film transistor device layer disposed over the shielding layer and comprising a first thin film transistor disposed in the display area and a second thin film transistor electrically connected to the first thin film transistor, wherein first source and drain electrodes included in the first thin film transistor are electrically connected to a first active layer through first via holes, second source and drain electrodes included in the second thin film transistor are electrically connected to a second active layer through second via holes;
   wherein the display panel further comprises a third via hole defined in the bonding area and extending through film layers between the second source and drain electrodes and the substrate, wherein each of the first via holes and the third via hole is a stair-step shaped hole, and distances from tops of the first via holes and the third via hole to corresponding first step platforms included in the stair-step shaped holes are the same, wherein the display panel further comprising a metal layer and a fourth via hole, wherein the metal layer is disposed between the second thin film transistor and the third via hole and is electrically connected to the shielding layer through the fourth via hole.

7. The display panel of claim 6, wherein the third via hole comprises the first step platform and a second step platform, the first step platform is located above the second step platform, and an aperture of the third via hole gradually decreases from the first step platform to the second step platform.

8. The display panel of claim 7, wherein a distance between the top of the third via hole and the first step platform is less than a distance between the first step platform and the second step platform.

9. The display panel of claim 7, wherein the first step platform is disposed in the same layer as the second active layer of the second thin film transistor.

10. The display panel of claim 6, wherein the fourth via hole is a stair-step shaped hole, and the first via holes, the second via holes, the third via hole, and the fourth via hole are prepared and formed by a same etching process.

11. The display panel of claim 10, wherein number of steps of the stair-step shaped hole corresponding to the fourth via hole is the same as number of steps of the third via hole, and step platforms included in the fourth via hole and step platforms included in the third via hole are located at same heights, respectively.

12. The display panel of claim 6, wherein the metal layer, the first source and drain electrodes, and the second source and drain electrodes are disposed in a same film layer.

13. The display panel of claim 6, wherein at least one of step platforms in each of the stair-step shaped holes corresponding to the first via hole and the third via hole is located on a same film layer.

14. The display panel of claim 6, wherein an aperture of the third via hole is greater than that of the first via hole and the second via hole.

15. The display panel of claim 6, wherein a distance between an opening surface of each of the first via hole, the third via hole, and the fourth via hole and the first step platform of the corresponding stair-step shaped hole is same.

16. The display panel of claim 15, wherein the distance between the opening surface of each of the first via hole, the third via hole, and the fourth via hole and the first step platform of the corresponding stair-step shaped hole ranges from 5500 angstroms (Å) to 6500 Å.

17. The display panel of claim 6, wherein the second active layer is an indium gallium zinc oxide semiconductor.

* * * * *